US006608439B1

United States Patent
Sokolik et al.

(10) Patent No.: US 6,608,439 B1
(45) Date of Patent: Aug. 19, 2003

(54) INORGANIC-BASED COLOR CONVERSION MATRIX ELEMENT FOR ORGANIC COLOR DISPLAY DEVICES AND METHOD OF FABRICATION

(75) Inventors: Igor Sokolik, Verbank, NY (US); Richard A. Campos, Cortlandt Manor, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 09/530,604

(22) PCT Filed: Sep. 22, 1999

(86) PCT No.: PCT/US99/21937

§ 371 (c)(1), (2), (4) Date: May 3, 2000

(87) PCT Pub. No.: WO00/17903

PCT Pub. Date: Mar. 30, 2000

Related U.S. Application Data

(60) Provisional application No. 60/101,412, filed on Sep. 22, 1998.

(51) Int. Cl.[7] .................. H05B 33/00; H05B 33/04; H05B 33/02
(52) U.S. Cl. .................. 313/512; 313/509; 313/504; 313/506
(58) Field of Search .................. 313/501, 504, 313/506, 512

(56) References Cited

U.S. PATENT DOCUMENTS 5,107,175 A * 4/1992 Hirano et al. ............... 313/512

(List continued on next page.)

OTHER PUBLICATIONS

Alivisatos, A.P., "Semiconductor clusters, nanocrystals, and quantum dots," Science 271 (Feb. 16, 1996), pp. 933–937.

C.B. Murray, D.J. Norris and M.G. Bawendi, "Synthesis and characterization of nearly monodisperse CdE (E=S, Se, Te) semiconductor nanocrystallites," J. Am. Chem. Soc. 115 (1993) 8706–8715.

Peter Weiss, "Connect the Dots, Transforming sunlight into electricity by means of quantum dust," Science News, vol. 157, Jun. 17, 2000, pp. 392–394.

*Primary Examiner*—Nimeshkumar D. Patel
*Assistant Examiner*—Mariceli Santiago
(74) *Attorney, Agent, or Firm*—Bazerman & Drangel, PC

(57) ABSTRACT

An integrated organic light emitting diode (OLED) color display device is disclosed. The OLED display device comprises at least one pixel element (10) capable of emitting visible light of varying wavelengths. Pixel element (10) may comprise: a substrate (100), an addressable two-dimensional matrix of organic light emitting diodes (120) that emits monochrome light, a color conversion matrix element (110) capable of absorbing the monochrome light and re-emitting that light at different wavelengths, and cover element (130). Color conversion matrix element (110) may further comprise at least one red color converting subelement (111), at least one green color converting subelement (112), and at least one blue color converting subelement (113). The color converting subelements (111, 112, and 113) may further comprise semiconductor nanocrystals (140) uniformly dispersed in a transparent organic binding material (150). The size distribution of the semiconductor nanocrystals (140) may be precisely controlled to define the capability for color conversion to a particular wavelength of re-emitted light. The color conversion matrix element (110) is fabricated separately from the organic light emitting diode matrix. A method for making an integrated organic light emitting diode display device comprising at least one pixel element (10) capable of emitting visible light of varying wavelengths is also disclosed.

35 Claims, 1 Drawing Sheet

U.S. PATENT DOCUMENTS

| | | |
|---|---|---|
| 5,126,214 A | 6/1992 | Tokailin et al. |
| 5,156,924 A * | 10/1992 | Taniguchi et al. .......... 313/506 |
| 5,294,870 A | 3/1994 | Tang et al. |
| 5,525,377 A | 6/1996 | Gallagher et al. |
| 5,537,000 A | 7/1996 | Alivisatos et al. |
| 5,559,057 A | 9/1996 | Goldstein |
| 5,585,640 A | 12/1996 | Huston et al. |
| 5,677,545 A | 10/1997 | Shi et al. |
| 5,705,285 A | 1/1998 | Shi et al. |
| 5,909,081 A * | 6/1999 | Eida et al. ................... 313/504 |
| 6,084,347 A * | 7/2000 | Xu et al. ..................... 313/504 |
| 6,114,055 A * | 9/2000 | Choong et al. ............. 313/504 |
| 6,121,726 A * | 9/2000 | Codama et al. ............. 313/504 |

* cited by examiner

INORGANIC-BASED COLOR CONVERSION MATRIX ELEMENT FOR ORGANIC COLOR DISPLAY DEVICES AND METHOD OF FABRICATION

CROSS-REFERENCE TO RELATED APPLICATIONS

This application relates to and claims priority on U.S. Provisional Application Ser. No. 60/101,412, filed Sep. 22, 1998 and entitled "Inorganic-Based Color Conversion Matrix Element for Organic Color Display Devices."

FIELD OF THE INVENTION

The present invention relates to color organic light emitting diode (OLED) video displays. In particular, the present invention is directed to color conversion elements incorporating semiconductor nanocrystals which are dispersed in a transparent binding material. Fabricated independently from the OLED layers, the color conversion elements absorb light that is emitted from the OLED layers at a first wavelength and re-emit this light at a different wavelength. The color conversion elements of the present invention may be employed in either down-emitting or up-emitting color OLED display devices.

BACKGROUND OF THE INVENTION

Organic light emitting diodes ("OLEDs") have been known for approximately two decades. All OLEDs work on the same general principles. One or more layers of semiconducting organic material are sandwiched between two electrodes. An electric current is applied to the device, causing negatively charged electrons to move into the organic material(s) from the cathode. Positive charges, typically referred to as holes, move in from the anode. The positive and negative charges meet in the center layers (i.e., the organic material), recombine, and produce photons. The wavelength of the photons—and consequently the color of the emitted light—depends on the electronic properties of the organic material in which the photons are generated.

In a typical OLED, at least one of the electrodes is transparent. The cathode may be constructed of a low work function material. The holes may be injected from a high workfunction anode material into the organic material. Typically, the devices operate with a DC bias of from 2 to 30 volts. The films may be formed by evaporation, spin casting, self-assembly or other appropriate film-forming techniques. Thicknesses typically range from a few mono layers to about 2,000 Angstroms.

In a typical passive matrix-addressed OLED display numerous OLEDs are formed on a single substrate and arranged in groups in a regular grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time.

An OLED may be designed to be viewed either from the "top" —the face opposite the foundational substrate—or from the "bottom" i.e., through the substrate, from the face opposite the light emitting layer. Whether the OLED is designed to emit light through the top or the bottom, the respective structure between the viewer and the light emitting material needs to be sufficiently transparent, or at least semi-transparent, to the emitted light. In many applications it is advantageous to employ an OLED display having topside light output. This permits the display to be built on top of a silicon driver chip for active matrix addressing.

The color of light emitted from the OLED display device can be controlled by the selection of the organic material. Specifically, the precise color of light emitted by a particular structure can be controlled both by selection of the organic material as well as by selection of luminescent impurities or dopants, added to the organic materials. By changing the kinds of organic solids making up the light-emitting layer, many different colors of light may be emitted, ranging from deep blue to red.

The color of light emitted from an OLED display device may be affected not only by the source material and/or doping of the light emitting layer, but also by color filters and color converters or color changing films that are formed above the OLED pixels or light emitting layers.

OLEDs have a number of beneficial characteristics. These include a low activation voltage (about 5 volts), fast response when formed with a thin light-emitting layer, and high brightness in proportion to the injected electric current. OLEDs are currently the subject of aggressive investigative efforts.

Although substantial progress has been made in the development of OLEDs to date, additional challenges remain. For example, there are drawbacks to the various existing approaches to the fabrication of the components that generate colored light in OLED displays. One approach provides a self-emissive pixelated display with RGB sub-pixels placed next to each other. This approach, in principle, allows the best possible performance because no light is lost through filter absorption or color conversion. It requires, however, precise shadow mask fabrication and alignment in the process of vacuum deposition for displays using low-molecular-weight material. Such precision in the fabrication of shadow masks is technologically difficult for miniature, high-resolution displays with pixel sizes in the range of several microns.

In a second design approach for making color OLEDs, pixels emitting white light are combined with precisely aligned color filter elements. The white light is changed to the color of the particular color filter. The color filters can be inefficient, however, because the filters inevitably absorb some light.

A third approach aligns photoluminescing color conversion elements with pixels emitting near ultraviolet or blue light.

The latter two approaches are technologically feasible given the present state of the art because all pixels emit the same color and the filter media can be patterned and aligned to the OLED pixels. When the relevant layers have high quantum efficiency of photoluminescence and internal losses are minimized, the third, or color conversion, technique provides better efficiency.

But even the color conversion technique has drawbacks. Most materials used for color conversion have broad emission photoluminescence spectra that require additional optical filters for spectra correction. These additional optical filters on top of the color conversion materials introduce additional loss of intensity.

In the present invention, Applicant presents an effective new design for color conversion through fabrication of appropriate, inorganic-based elements that provide narrow photoluminescence emission bands upon optical stimulation by a higher photon energy source. Semiconductor nanocrystals are known to have narrow and tunable emission bands which are determined very specifically by their size, yet are not dependent on the details of the near ultraviolet or blue excitation spectrum. This permits all three color conversion elements (red, green and blue) to be pumped by a single excitation source, for example, the organic electroluminescence display matrix element. Semiconductor nanocrystals (e.g., passivated CdSe) are widely tunable in the size range of approximately 10 to 200 Angstroms, which covers optical conversion through the visible spectrum, and can be controllably fabricated with narrow size distributions from scalable colloidal precipitation and other techniques known in the prior art.

In the present invention, the layer or layers containing the semiconductor nanocrystals are fabricated independently from the OLED layers. Stable films of semiconductor nanocrystals can be patterned using standard photolithographic techniques unlike the OLED layers which are sensitive to humidity and other environmental variations.

Previous approaches for color conversion have focused specifically on the use of organic dye molecular systems such that the red, green and blue color converters may require completely different synthetic routes, thus increasing manufacturing complexity. For example, U.S. Pat. No. 5,126,214 to Tokailin et al. discloses the use of an organic electroluminescent matrix element, together with a fluorescent material part that corresponds functionally to the color conversion element of the present invention. The fluorescent material part emits a fluorescence in a visible light range from red to blue. Tokailin et al. disclose the use of fluorescent dye materials to provide color conversion. In contrast, the present invention uses semiconductor nanocrystals for color conversion.

Similarly, U.S. Pat. No. 5,294,870 to Tang et al. contains reference to both organic and inorganic dye materials that perform color conversion.

The benefits of the present invention relate directly to fundamental properties of semiconducting nanocrystals as described in the available research literature.

For example, a review of the status of semiconductor quantum nanocrystal research is presented by A. P. Alivisatos in "Semiconductor clusters, nanocrystals, and quantum dots," Science 271 (Feb. 16, 1996) 933–937. In addition, an article by C. B. Murray, D. J. Norris and M. G. Bawendi, "Synthesis and characterization of nearly monodisperse CdE (E=S, Se, Te) semiconductor nanocrystallites," J. Am. Chem. Soc. 115 (1993) 8706–8715, contains detailed art about the synthesis and properties of nanocrystals from the cadmium family.

Methods of fabricating semiconductor nanocrystals are disclosed in U.S. Pat. No. 5,559,057 to Goldstein (method of manufacturing thin films from nanocrystal precursors) and U.S. Pat. No. 5,525,377 to Gallagher et al. (method of making doped encapsulated semiconductor nanocrystallites for use in thin films for electroluminescent displays.)

The beneficial properties of semiconductor nanocrystals in application to color OLED display technology include the following: the photoluminescence color of semiconducting nanocrystals depends proportionally on their size. This assures tunability of photoluminescence and permits direct determination of nanosphere distribution from the position and width of the photoluminescence spectrum. This provides an analytical process benefit and is a key enabler. In the present invention, precise control of the nanocrystal size distribution defines the capability for color conversion to the red, green and blue that form subelements comprising, each color pixel of the integrated display.

In addition, delocalization of the electronic states over each nanosphere, coupled with passivation techniques, support immunity from local film environmental details. This provides better stability, especially in comparison with known organic strategies to achieve color conversion.

Nanocrystals of different sizes manifest a broad excitation spectrum which permits conversion to red, green and blue colors without the requirement for color-specific pumping; namely, a single electroluminescent matrix element can generate all the light required to permit conversion by the nanocrystal films into red, green and blue subpixel elements. This permits integration simplicity in the OLED device design.

Another beneficial attribute relates to the synthesis of semiconductor nanocrystals via organometallic precursor injection. This type of synthesis is independent of the reaction vessel, therefore it is scalable, which can reduce manufacturing cost. Alternative synthesis processes such as chemical vapor deposition are also available, giving more options for manufacturing flexibility.

Patterning of nanocrystal films may be done using standard photolithographic art. This is another cost-effective enabler.

The known art comprises OLED display devices that utilize semiconductor nanocrystals to emit light of different wavelengths. For example, U.S. Pat. No. 5,537,000 to Alivisatos et al. discloses an electroluminescent device with a semiconductor nanocrystal electron transport layer capable of emitting light of various wavelengths. This design contemplates production of different colors of emitted light by varying the voltage applied to the device, or, as in the present invention, by varying the size or type of semiconductor nanocrystal. The design disclosed by Alivisatos et al. combines the semiconductor nanocrystals with the organic electron transport layer, which together emit the light of different wavelengths. In contrast, the present invention provides the semiconductor nanocrystals in a separate layer or layers that are fabricated independently from the OLED layers. In Alivisatos et al., the nanocrystal/OLED layer emits the light at different wavelengths. In the present invention the OLED layer emits light at one wavelength (preferably blue). Then the semiconductor nanocrystal layer or layers absorb the light that is emitted by the OLED layers and re-emit that light a different wavelengths, to produce red and green colors. The blue light emitted by the OLED layers of the present invention may be re-emitted by the semiconductor nanocrystal layer or layers at a different wavelength. In the present invention, the separation of the fabrication of the light emitting OLED layers from fabrication of the color conversion layers makes it possible to manufacture miniature displays cost-effectively.

U.S. Pat. No. 5,677,545 to Shi et al. discloses an OLED with a coupling layer between two organic layers. The coupling layer may comprise fluorescent nanocrystals whose size may tune the color of the light emission. Like the Alivisatos et al. design, the Shi et al. design emits light of various colors from the nanocrystal/OLED layers. This presents manufacturing obstacles that are overcome in the present invention, which separates the fabrication of the OLED layers from that of the semiconductor nanocrystal layer or layers.

It has been a continuing challenge to devise OLED structures which provide superior color displays, at maximum efficiency, all in a miniature environment. Accordingly, there is a need for a miniature OLED design that provides a more effective means of color conversion of emitted light.

There is also a need for a more efficient method to effect the conversion of high photon energy electroluminescence from an OLED display element into lower photon energy photoluminescence in order to build an integrated color organic electroluminescence display device. There is also a need for an improved method of fabricating an integrated color display device onto standard substrates such as glass or silicon, using standard photolithographic techniques. The present invention meets these needs, and provides other benefits as well.

OBJECTS OF THE INVENTION

It is therefore an object of the present invention to provide an economical manufacturing process for a color OLED display device.

It is another object of the present invention to provide a color OLED display device made by a scalable synthetic process that allows manufacturing cost reductions.

It is still another object of the present invention to provide a color OLED display device which may be made by an alternative synthetic process such as chemical vapor deposition.

It is yet another object of the present invention to provide an improved method for fabricating a color OLED display device onto standard substrates.

It is a further object of the present invention to provide an integrated color OLED display device using standard photolithographic techniques.

It is still a further object of the present invention to provide an integrated color OLED display device in which high photon energy electroluminescence from the OLED display element is converted into lower photon energy photoluminescence.

It is yet a further object of the present invention to provide a color OLED display device with efficient color conversion means.

It is another object of the present invention to provide a color OLED display-device with color conversion elements that can be fabricated using standard photolithographic techniques.

It is still another object of the present invention to provide a color OLED display device with color conversion elements that have narrow photoluminescence bands.

It is yet another object of the present invention to provide a color OLED display device with color conversion elements that have widely tunable emission bands.

It is a further object of the present invention to provide a color OLED display device with inorganic-based color conversion elements.

It is still a further object of the present invention to provide a color OLED display device using films of inorganic semiconductor nanocrystals as the color conversion elements.

It is yet a further object of the present invention to provide a color OLED display device with color conversion elements that are not dependent on the details of the near ultraviolet or blue excitation spectrum.

It is another object of the present invention to provide a color OLED display device wherein all three color conversion elements can be pumped by a single excitation source.

It is yet another object of the present invention to provide a color OLED display device with color conversion elements that can be controllably fabricated with narrow size distributions.

It is still another object of the present invention to provide a color OLED display device with color conversion elements that can be fabricated from scalable colloidal precipitation.

It is a further object of the present invention to provide a color OLED display device with an efficient "down-emitting" display.

It is yet a further object of the present invention to provide a color OLED display device with an efficient "up-emitting" display.

It is still a further object of the present invention to provide a color OLED display device with color conversion elements that permit direct determination of the nanosphere distribution from the position and width of the photoluminescence spectrum.

It is another object of the present invention to provide a color OLED display device with improved stability of the color conversion elements.

It is still another object of the present invention to provide a color OLED display device having color conversion elements that do not require color-specific pumping.

It is yet another object of the present invention to provide a color OLED display device with greater integration simplicity in its color conversion.

It is a further object of the present invention to provide a method of making a color OLED display device that permits fabrication of the light-emitting OLED layers independent of the fabrication of the light-absorbing and re-emitting semiconductor nanocrystal layer or layers.

Additional objects and advantages of the invention are set forth, in part in the description which follows and, in part, will be apparent to one of ordinary skill in the art from the description and/or from the practice of the invention.

BRIEF SUMMARY OF THE INVENTION

As illustrated in the accompanying drawings and disclosed in the accompanying claims, the invention is an integrated organic light emitting diode (OLED) color display device. The OLED color display device comprises at least one pixel element capable of emitting visible light of varying wavelengths.

A pixel element for the organic light emitting diode color display device may comprise: a substrate; a transparent element through which the visible light is emitted; an addressable two-dimensional organic light emitting diode matrix that emits monochrome light, in contact with at least one of the substrate and the transparent element; a color conversion matrix element for conversion of the wavelength of the monochrome light, in contact with the organic light emitting diode matrix and at least one of the substrate and the transparent element; and a cover element for protecting the color conversion matrix element and the organic light emitting diode matrix against physical, chemical or thermal damage, in contact with at least one of the color conversion matrix element and the organic light emitting diode matrix. The color conversion matrix element may absorb the monochrome light emitted from the organic light emitting diode matrix and re-emit the visible light at different wavelengths.

The pixel element may further comprise a two-dimensional array of color conversion elements. The color conversion matrix element may further comprise at least one red, at least one green and at least one blue color converting subelement and a plurality of semiconductor nanocrystals uniformly dispersed in a transparent organic binding material. The color conversion matrix element may be fabricated independently from the organic light emitting diode matrix. The color conversion matrix element may comprise at least one layer. The semiconductor nanocrystals may be selected from the group of the semiconductor compounds CdS, CdSe and CdTe and mixtures of two or more of the semiconductor compounds.

In the device of the present invention, the color of the visible light re-emitted by the color conversion matrix element is tunable by altering the size of the semiconductor nanocrystals and the size distribution of the semiconductor nanocrystals is precisely controlled to define the capability for color conversion to a particular wavelength of re-emitted light.

The red color converting subelement may further comprise semiconductor nanocrystals that absorb the monochrome light emitted from the organic light emitting diode matrix and re-emit the monochrome light as red light. The green color converting subelement may further comprise semiconductor nanocrystals that absorb the monochrome light emitted from the organic light emitting diode matrix and re-emit the monochrome light as green light. The blue color converting subelement may further comprise at least one of (a) the transparent organic binding material without semiconductor nanocrystals such that the blue color converting subelement is transparent to the monochrome light; and (b) an optical filter without semiconductor nanocrystals, capable of spectrum correction and transparent to the monochrome light. In an alternate embodiment the blue color converting subelement may comprise semiconductor nanocrystals that absorb the monochrome light emitted from the organic light emitting diode matrix and re-emit the monochrome light as a different wavelength of blue light.

In a first embodiment of the present invention, the color conversion matrix element is formed in contact with the substrate, which is the transparent element and the cover is formed in contact with the organic light emitting diode matrix. In this embodiment, the pixel element is a component of a "down-emitting" OLED display device.

In a second embodiment of the present invention, the organic light emitting diode matrix is formed in contact with the substrate; the substrate is opaque; the cover is formed in contact with the color conversion matrix element; and the cover is the transparent element. In this alternate embodiment, the pixel element is a component of an "up-emitting" OLED display device.

The present invention is also directed to a color display device for providing an image utilizing light emitted from at least one pixel element capable of emitting visible light of varying wavelengths. The display device may comprise: a substrate; a transparent element through which the visible light is emitted; an addressable two-dimensional organic light emitting diode matrix that emits monochrome light, in contact with at least one of the substrate and the transparent element; a color conversion matrix element for conversion of the wavelength of the monochrome light, in contact with the organic light emitting diode matrix and at least one of the substrate and the transparent element; and wherein the color conversion matrix element (a) may absorb the monochrome light emitted from the organic light emitting diode matrix and re-emit the visible light at different wavelengths; (b) may further comprise a two-dimensional array of color conversion elements; (c) may further comprise at least one red, at least one green and at least one blue color converting subelement; (d) may further comprise a plurality of semiconductor nanocrystals uniformly dispersed in a transparent organic binding material; (e) may further comprise at least one layer; and (f) may be fabricated independently from the organic light emitting diode matrix; and a cover element for protecting the color conversion matrix element and the organic light emitting diode matrix against physical chemical or thermal damage, in contact with at least one of the color conversion matrix element and the organic light emitting diode matrix.

In the display device, the semiconductor nanocrystals are selected from the group of the semiconductor compounds CdS. CdSe and CdTe and mixtures of two or more of the semiconductor compounds. The color of the visible light re-emitted by the color conversion matrix element is tunable by altering the size of the semiconductor nanocrystals and the size distribution of the semiconductor nanocrystals is precisely controlled to define the capability for color conversion to a particular wavelength of re-emitted light.

In the display device, the red color converting subelement may further comprise semiconductor nanocrystals that absorb the monochrome light emitted from the organic light emitting diode matrix and re-emit the monochrome light as red light; the green color converting subelement may further comprise semiconductor nanocrystals that absorb the monochrome light emitted from the organic light emitting diode matrix and re-emit the monochrome light as green light; and the blue color converting subelement may further comprise at least one of (a) the transparent organic binding material without semiconductor nanocrystals such that the blue color converting subelement is transparent to the monochrome light; and (b) an optical filter without semiconductor nanocrystals, capable of spectrum correction and transparent to the monochrome light.

In an alternate embodiment of the display device of the present invention, the blue color converting subelement may comprise semiconductor nanocrystals that absorb the monochrome light emitted from the organic light emitting diode matrix and re-emit the monochrome light as a different wavelength of blue light.

In a first embodiment of the display device of the present invention, the color conversion matrix element is formed in contact with the substrate; the substrate is the transparent element; and the cover is formed in contact with the organic light emitting diode matrix. In this embodiment, the display device is a "down-emitting" OLED display device.

In a second embodiment of the display device of the present invention, the organic light emitting diode matrix is formed in contact with the substrate; the substrate is opaque; the cover is formed in contact with the color conversion matrix element; and the cover is the transparent element. In this embodiment, the display device is an "up-emitting" OLED display device.

The present invention is also directed to a method of fabricating an integrated organic light emitting diode color display device comprising at least one pixel element capable of emitting visible light of varying wavelengths, comprising the steps of: forming a substrate; forming a transparent element through which the visible light is emitted; forming an addressable two-dimensional organic light emitting diode matrix that emits monochrome light in contact with at least one of the substrate and the transparent element; forming a color conversion matrix element for conversion of the wavelength of the monochrome light, in contact with the organic light emitting diode matrix and at least one of the substrate and the transparent element; wherein the color conversion matrix element may absorb the monochrome light emitted from the organic light emitting diode matrix and re-emit the visible light at different wavelengths; and forming a cover element for protecting the color conversion matrix element and the organic light emitting diode matrix against physical, chemical or thermal damage, in contact with at least one of the color conversion matrix element and the organic light emitting diode matrix. The step of forming the color conversion matrix element is independent from the step of forming the organic light emitting diode matrix. The method may further comprise the step of providing the color conversion matrix element with a plurality of semiconductor nanocrystals uniformly dispersed in a transparent organic binding material. The method may further comprise the step of altering the size of the semiconductor nanocrystals in order to tune the color of the visible light re-emitted by the color conversion matrix element. The method may further comprise the step of precisely controlling the size distribution of the semiconductor nanocrystals in order to define the capability for color conversion to a particular wavelength of re-emitted light.

It is to be understood that both the foregoing general description and the following detailed description are exemplary and explanatory only, and are not restrictive of the invention as claimed. The accompanying drawings, which are incorporated herein by reference, and which constitute part of the specification, illustrate certain embodiments of the invention, and together with the detailed descriptions served to explain the principles of the present invention.

BRIEF DESCRIPTION OF THE DRAWINGS

The invention will now be described in conjunction with the following drawings in which like reference numerals designate like elements and wherein.

DETAILED DESCRIPTION OF THE PREFERRED EMBODIMENTS

Figure 1:
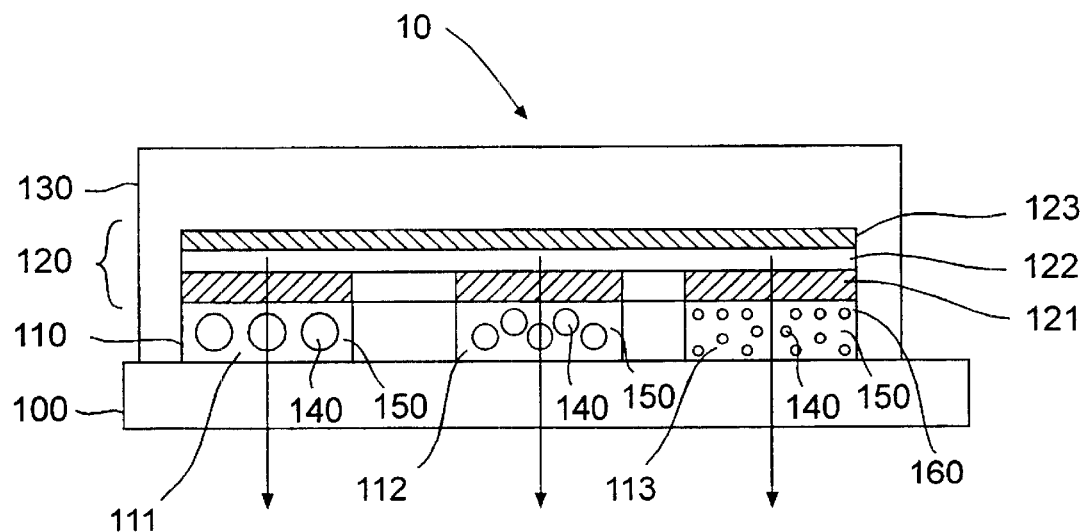
FIG. 1 depicts a cross-section of a single pixel element for a down-emitting OLED display device according to the present invention.

Reference will now be made in detail to preferred embodiments of the present invention, examples of which are illustrated in the accompanying drawings. An embodiment of a single pixel element for a down-emitting color organic light emitting diode (OLED) for video display according to the present invention is shown as 10 in FIG. 1. In this embodiment, pixel element 10 comprises flat substrate 100, with color conversion matrix element 110 disposed thereon. Substrate 100 is transparent for this down-emitting device, such that the emitted light exits in the viewer's direction. In this embodiment, an addressable two-dimensional matrix of monochrome organic light emitting diodes (OLEDs) 120 emitting in the blue region of the electromagnetic spectrum (near 450 nm peak wavelength) is formed in contact with color conversion matrix element 110.

As embodied herein, color conversion matrix element 110 comprises a two-dimensional array of three subelements for color conversion. Subelement 111 converts emitted light to red and subelement 112 converts emitted light to green. Subelement 113 emits blue light directly.

In this embodiment, color conversion subelements 111 and 112 may be composed of semiconductor nanocrystals 140 uniformly dispersed in a suitable organic binding material 150. Nanocrystals 140 may be formed from Cdx, where x may be chosen from S, Se or Te. Organic binding material 150 may be polycarbonate or other polymer, oligomer, monomer or a mixture of these. Each pixel element 10 of the integrated display comprises one red 111 and one green 112 color converting semiconductor nanocrystal subelement capable of absorbing blue light (near 450 nm peak wavelength) and converting the blue light into green and red light (near 540 nm and 620 nm peak wavelengths, respectively) by virtue of the size distribution of the nanocrystals comprising each subelement. Blue subelement 113 of each display pixel 10 contains pure binder 150 or optical filter 160 for spectrum correction without nanocrystals and is transparent to the blue light. The red 111, green 112 and blue 113 pixel subelements are sequentially patterned side-by-side using conventional photolithographic methods, directly on substrate 100.

As embodied herein, OLED stack 120 comprises vertically stacked, semitransparent electrode 121 formed in contact with color conversion subelements 111, 112 and 113 organic layer or layers 122 formed in contact with electrode 121, and reflecting electrode 123 formed in contact with organic layer or layers 122.

Cover element 130 encapsulates reflecting electrode 123, organic layer or layers 122, semitransparent electrode 121 and color conversion matrix element 110. Cover element 130 seals the OLED device to prevent degradation from physical, chemical and/or thermal damage. In this embodiment, reflecting electrode 123, organic layer or layers 122, semitransparent electrode 121 and color conversion matrix element 110 may be fabricated sequentially onto substrate 100 prior to encapsulation.

As embodied herein, pixel element 10 operates as follows: upon the application of suitable voltages to the device, light originates in the electroluminescent elements of semi-transparent electrode 121, organic layer or layers 122 and reflecting electrode 123. Color differentiation of the emitted light is motivated by the differently sized populations of dispersed semiconductor nanocrystals in color conversion subelements 111 and 112.

This embodiment of the present invention is a "down emitting" display because the blue and color-converted red and green light passes through transparent substrate 100 in the direction of the viewer.

Figure 2:
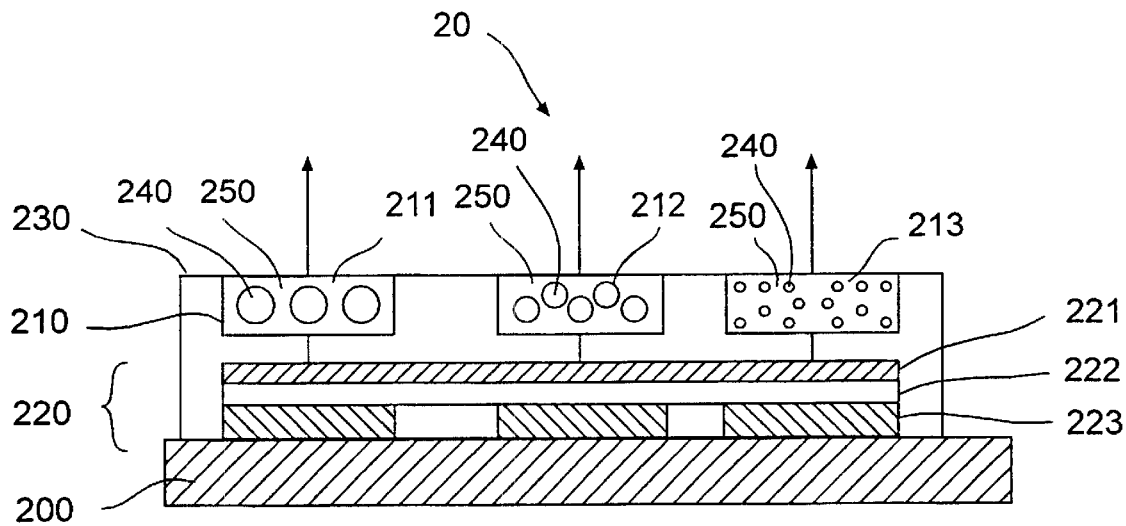
FIG. 2 depicts a cross-section of a single pixel element for an up-emitting OLED display device according to the present invention.

An alternate embodiment of the present invention for an up-emitting color organic light emitting diode (OLED) for video display is shown in FIG. 2 as single pixel element 20. In the alternative embodiment, single pixel element 20 comprises opaque substrate 200 onto which the organic light-emitting elements or OLED stack 220 are patterned. OLED stack 220 comprises reflecting electrode 223, organic layer or layers 222 and semitransparent electrode 221. Because light exits in the upward direction, color conversion matrix element 210 is patterned onto encapsulation cover element 230. Color conversion subelements 211, 212 and 213 are aligned to the processed substrate 200 during the sealing process.

As embodied herein, pixel element 20 operates as follows: upon the application of suitable voltages to the device, light originates in the electroluminescent elements of semi-transparent electrode 221, organic layer or layers 222 and reflecting electrode 223. Color differentiation of the emitted light is motivated by the differently sized populations of dispersed semiconductor nanocrystals in color conversion subelements 211 and 212.

While this invention has been described in conjunction with specific embodiments thereof, it is evident that many alternatives, modifications and variations will be apparent to those skilled in the art. For example, color conversion matrix element 110 and OLED stack 120 may be patterned on opposite surfaces of substrate 100. In another modification, OLED stack 120 comprises organic layer or layers 122 which are capable of emitting light in the near ultraviolet region of the electromagnetic spectrum (200–400 nm peak wavelength), and each blue subelement 113 of color conversion matrix element 110 contains a blue conversion element comprised of semiconductor nanocrystals 140 dispersed uniformly in a suitable binder 150 capable of converting the reflected light into the blue (450 nm peak) wavelength.

Accordingly, the preferred embodiments of the invention as set forth herein are intended to be illustrative, not limiting.

What is claimed is:

1. A pixel element for an organic light emitting diode display device; said pixel element capable of emitting visible light of varying wavelengths comprising:
   a substrate;
   a transparent element through which said visible light is emitted;
   an addressable two-dimensional organic light emitting diode matrix that emits monochrome light, in contact with at least one of said substrate and said transparent element;
   a color conversion matrix element for conversion of the wavelength of said monochrome light, in contact with said organic light emitting diode matrix and at least one of said substrate and said transparent element;
   a cover element for protecting said color conversion matrix element and said organic light emitting diode matrix against physical, chemical or thermal damage, in contact with at least one of said color conversion matrix element and said organic light emitting diode matrix; and
   wherein said color conversion matrix element absorbs said monochrome light emitted from said organic light emitting diode matrix and re-emits said visible light at different wavelengths;
   wherein said color conversion matrix element further comprises a two-dimensional array of color conversion elements;
   wherein said color conversion matrix element further comprises at least one red, at least one green and at least one blue converting subelement;
   wherein said color conversion matrix element further comprises a plurality of semiconductor nanocrystals uniformly dispersed in a transparent organic binding material.

2. The pixel element of claim 1, wherein said color conversion matrix element is fabricated independently from said organic light emitting diode matrix.

3. The pixel element of claim 2, wherein said semiconductor nanocrystals are selected from the group of the semiconductor compounds CdS, CdSe and CdTe and mixtures of two or more of said semiconductor compounds.

4. The pixel element of claim 3, wherein the color of said visible light re-emitted by said color conversion matrix element is tunable by altering the size of said semiconductor nanocrystals.

5. The pixel element of claim 4, wherein the size distribution of said semiconductor nanocrystals is precisely controlled to define the capability for color conversion to a particular wavelength of re-emitted light.

6. The pixel element of claim 5, wherein said red color converting subelement further comprises semiconductor nanocrystals that absorb said monochrome light emitted from said organic light emitting diode matrix and re-emit said monochrome light as red light.

7. The pixel element of claim 5, wherein said green color converting subelement further comprises semiconductor nanocrystals that absorb said monochrome light emitted from said organic light emitting diode matrix and re-emit said monochrome light as green light.

8. The pixel element of claim 5, wherein said blue color converting subelement further comprises at least one of
   (a) said transparent organic binding material without semiconductor nanocrystals such that said blue color converting subelements transparent to said monochrome light; and
   (b) an optical filter without semiconductor nanocrystals, capable of spectrum correction and transparent to said monochrome light.

9. The pixel element of claim 4, wherein said substrate is said transparent element.

10. The pixel element of claim 9, wherein said cover is formed in contact with said organic light emitting diode matrix.

11. The pixel element of claim 10, wherein said pixel element is a component of a "down-emitting" OLED display device.

12. The pixel element of claim 1, wherein said color conversion matrix element comprises at least one layer.

13. The pixel element of claim 1, wherein said organic light emitting diode matrix is formed in contact with said substrate.

14. The pixel element of claim 13, wherein said substrate is opaque.

15. The pixel element of claim 14, wherein said cover is formed in contact with said color conversion matrix element.

16. The pixel element of claim 15, wherein said cover is said transparent element.

17. The pixel element of claim 16, wherein said pixel element is a component of an "up-emitting" OLED display device.

18. A color display device for providing an image utilizing light emitted from at least one pixel element capable of emitting visible light of varying wavelengths, said display device comprising:
   a substrate;
   a transparent element through which said visible light is emitted;
   an addressable two-dimensional organic light emitting diode matrix that emits monochrome light, in contact with at least one of said substrate and said transparent element;
   a color conversion matrix element for conversion of the wavelength of said monochrome light, in contact with said organic light emitting diode matrix and at least one of said substrate and said transparent element; and
   wherein said color conversion matrix element:
   (a) absorbs said monochrome light emitted from said organic light emitting diode matrix and re-emits said visible light at different wavelengths;
   (b) further comprises a two-dimensional array of color conversion elements;
   (c) further comprises at least one red, at least one green, and at least one blue color converting subelement;
   (d) further comprises a plurality of semiconductor nanocrystals uniformly dispersed in a transparent organic binding material;

(e) further comprises at least one layer; and
(f) is fabricated independently from said organic light emitting diode matrix; and a cover element for protecting said color conversion matrix element and said organic light emitting diode matrix against physical, chemical or thermal damage, in contact with at least one of said color conversion matrix element and said organic light emitting diode matrix.

19. The display device of claim 18, wherein said semiconductor nanocrystals are selected from the group of the semiconductor compounds CdS, CdSe and CdTe and mixtures of two or more of said semiconductor compounds.

20. The display device of claim 19, wherein the color of said visible light re-emitted by said color conversion matrix element is tunable by altering the size of said semiconductor nanocrystals.

21. The display device of claim 20, wherein the size distribution of said semiconductor nanocrystals is precisely controlled to define the capability for color conversion to a particular wavelength of re-emitted light.

22. The display device of claim 21, wherein said red color converting subelement further comprises semiconductor nanocrystals that absorb said monochrome light emitted from said organic light emitting diode matrix and re-emit said monochrome light as red light; said green color converting subelement further comprises semiconductor nanocrystals that absorb said monochrome light emitted from said organic light emitting diode matrix and re-emit said monochrome light as green light; and said blue color converting subelement further comprises at least one of (a) said transparent organic binding material without semiconductor nanocrystals such that said blue color converting subelement is transparent to said monochrome light; and (b) an optical filter without semiconductor nanocrystals, capable of spectrum correction and transparent to said monochrome light.

23. The display device of claim 21, wherein said blue color converting subelement further comprises semiconductor nanocrystals that absorb said monochrome light emitted from said organic light emitting diode matrix and re-emit said monochrome light as a different wavelength of blue light.

24. The display device of claim 21, wherein said color conversion matrix element is formed in contact with said substrate.

25. The display device of claim 24, wherein said substrate is said transparent element.

26. The display device of claim 25, wherein said cover is formed in contact with said organic light emitting diode matrix.

27. The display device of claim 26, wherein said display device is a "down-emitting" OLED display device.

28. The displace device of claim 21, wherein said organic light emitting diode matrix is formed in contact with said substrate.

29. The display device of claim 28, wherein said substrate is opaque.

30. The display device of claim 29, wherein said cover is formed in contact with said color conversion matrix element.

31. The display device of claim 30, wherein said cover is said transparent element.

32. The display device of claim 31, wherein said display device is an "up-emitting" OLED display device.

33. A method of fabricating an integrated organic light emitting diode color display device comprising at least one pixel element capable of emitting visible light of varying wavelengths, comprising the steps of:

forming a substrate;

forming a transparent element through which said visible light is emitted;

forming an addressable two-dimensional organic light emitting diode matrix that emits monochrome light, in contact with at least one of said substrate and said transparent element;

forming a color conversion matrix element for conversion of the wavelength of said monochrome light, in contact with said organic light emitting diode matrix and at least one of said substrate and said transparent element;

wherein said color conversion matrix element absorbs said monochrome light emitted from said organic light emitting diode matrix and re-emits said visible light at different wavelengths;

forming a cover element for protecting said color conversion matrix element and said organic light emitting diode matrix against physical, chemical or thermal damage, in contact with at least one of said color conversion matrix element and said organic light emitting diode matrix; and wherein said step of forming said color conversion matrix element is independent from said step of forming said organic light emitting diode matrix;

wherein said color conversion matrix element further comprises a plurality of semiconductors nanocrystals uniformly dispersed in a transparent organic binding material.

34. The method of claim 33, further comprising the step of altering the size of said semiconductor nanocrystals in order to tune the color of said visible light re-emitted by said color conversion matrix element.

35. The method of claim 34, further comprising the step of precisely controlling the size distribution of said semiconductor nanocrystals in order to define the capability for color conversion to a particular wavelength of re-emitted light.

* * * * *